US006252294B1

(12) United States Patent
Hattori et al.

(10) Patent No.: US 6,252,294 B1
(45) Date of Patent: Jun. 26, 2001

(54) SEMICONDUCTOR DEVICE AND SEMICONDUCTOR STORAGE DEVICE

(75) Inventors: Nobuyoshi Hattori; Hideki Naruoka; Hidekazu Yamamoto, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/438,578

(22) Filed: Nov. 12, 1999

(30) Foreign Application Priority Data

May 7, 1999 (JP) .................................................. 11-126893

(51) Int. Cl.[7] ........................... H01L 27/01; H01L 27/12; H01L 31/0392; H01L 23/544
(52) U.S. Cl. ........................... 257/620; 257/350; 257/903; 257/913
(58) Field of Search ..................................... 257/620, 350, 257/903, 913

(56) References Cited

U.S. PATENT DOCUMENTS 5,482,869 * 1/1996 Kohyama ................................ 437/12
5,753,560 * 5/1998 Hong et al. ............................ 438/402

FOREIGN PATENT DOCUMENTS

| 4-72631 | 3/1992 | (JP) . |
| 5-82525 | 4/1993 | (JP) . |
| 6-283421 | 10/1994 | (JP) . |
| 8-45943 | 2/1996 | (JP) . |
| 8-116038 | 5/1996 | (JP) . |
| 8-139295 | 5/1996 | (JP) . |
| 8-191140 | 7/1996 | (JP) . |
| 10-135226 | 5/1998 | (JP) . |

* cited by examiner

Primary Examiner—Ngân V. Ngô
(74) Attorney, Agent, or Firm—McDermott, Will & Emery

(57) ABSTRACT

A semiconductor device and a semiconductor storage device having an SOI structure and being enable sufficient gettering performance without imposing limitations on the freedom of design of an LSI circuit. A semiconductor device includes a semiconductor wafer of SOI structure which has a insulation layer and a silicon layer provided thereon, wherein the semiconductor wafer includes a plurality of element fabrication regions where semiconductor elements are fabricated, and a cutting region provided between the element fabrication regions. Gettering sites are formed in the cutting region by means of embedding a gettering member into grooves of predetermined depth.

20 Claims, 12 Drawing Sheets

2: support substrate
3: insulation layer
4: silicon layer
6: groove
7: gettering member 2: support substrate
3: insulation layer
4: silicon layer
6: groove
7: gettering member 1a: element fabrication region
1b: cutting region
1: semiconductor wafer 8:photoresist film

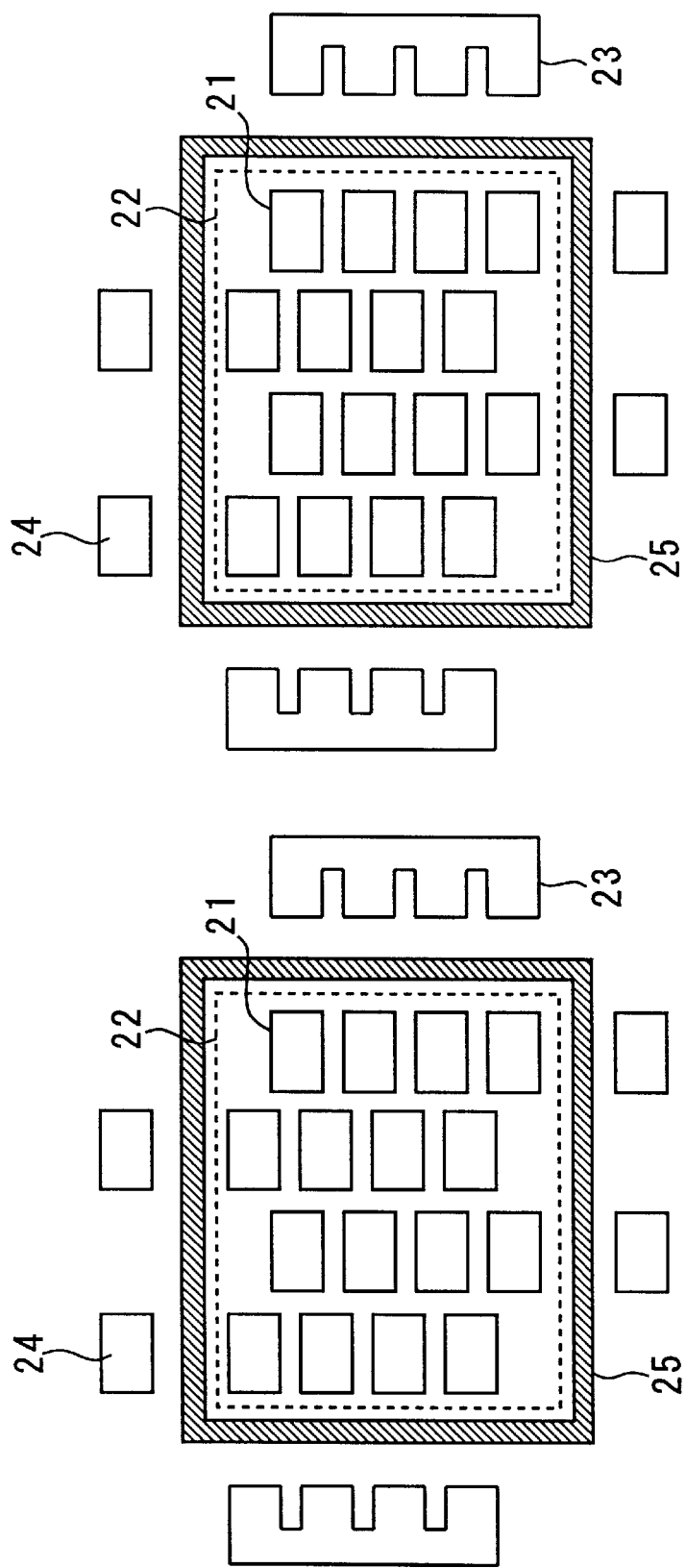

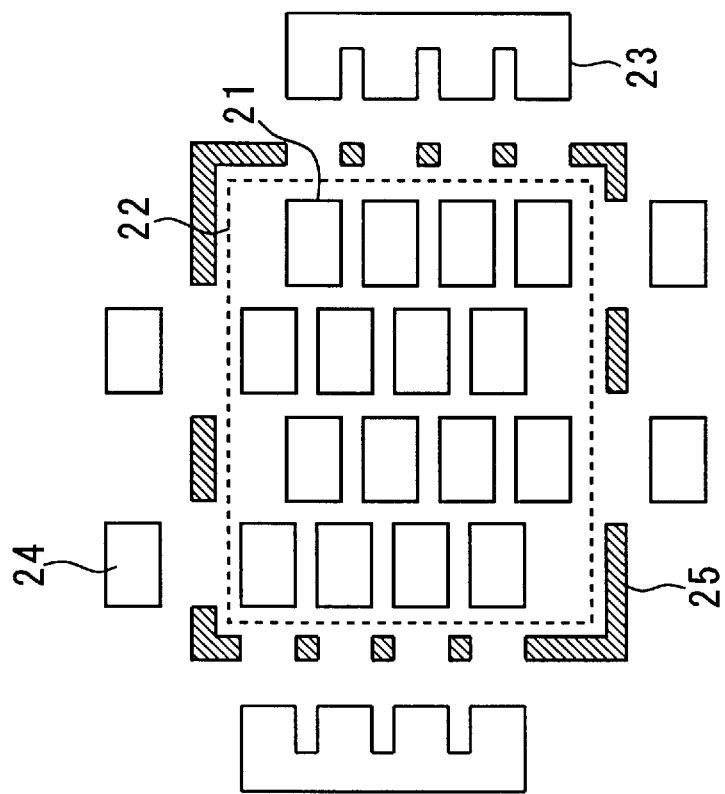
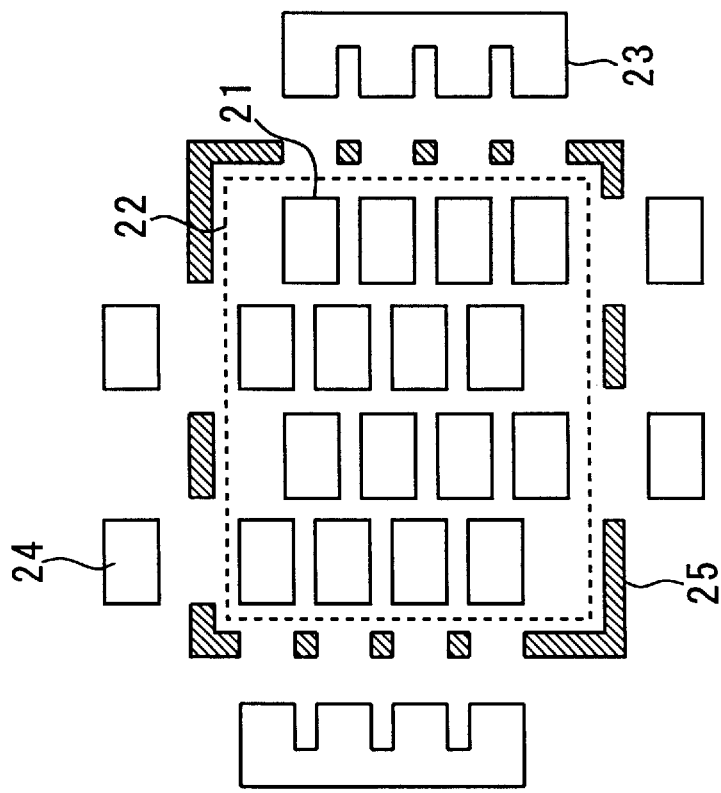
FIG. 7

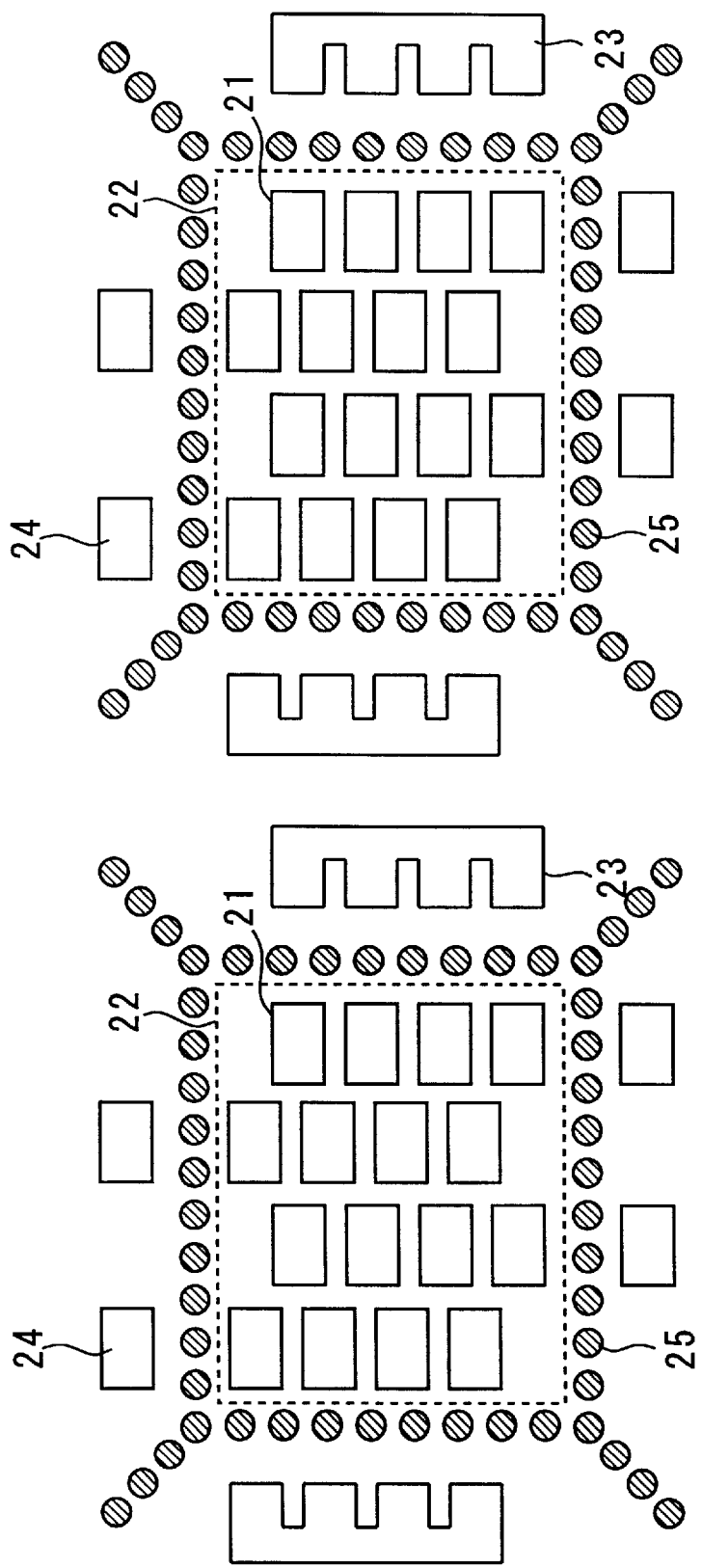

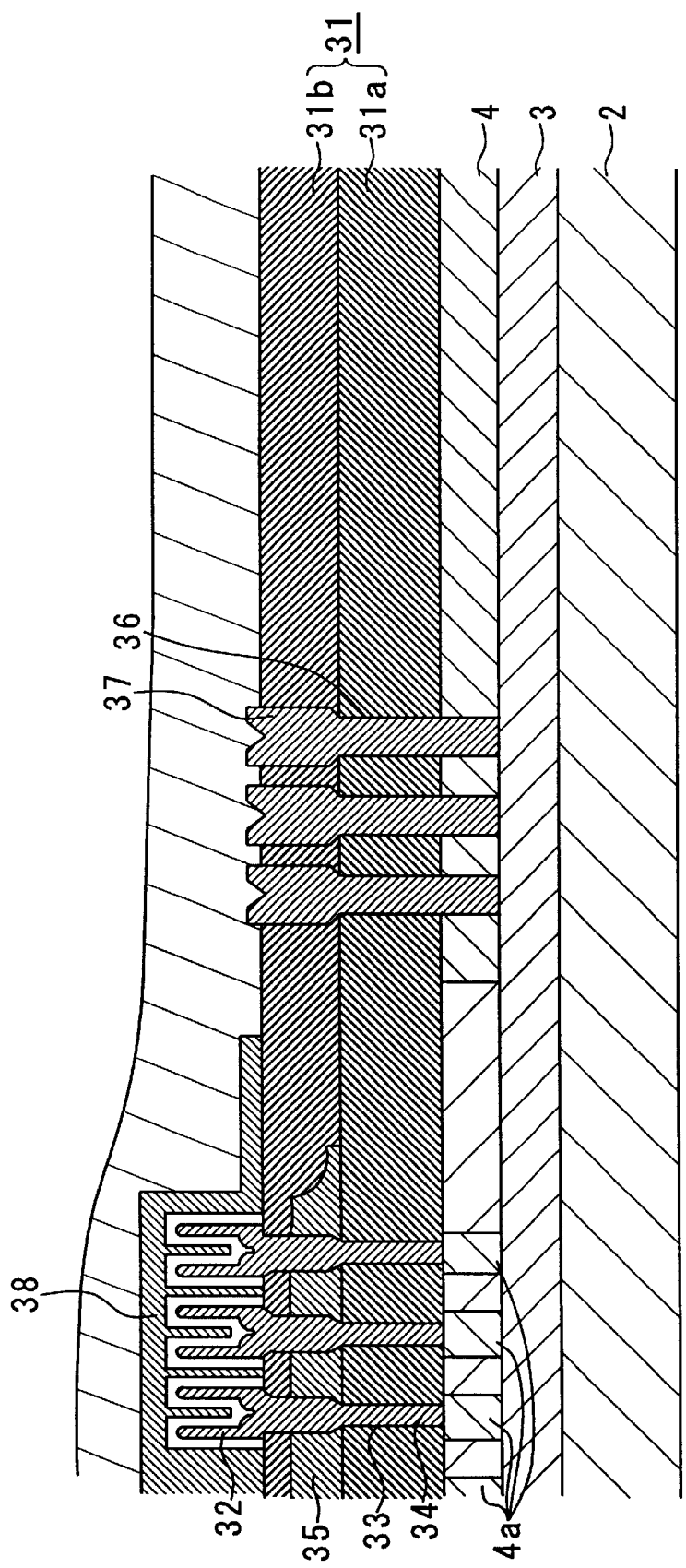

36: hole
39: photoregist film
40: polycrystalline silicon film 41a, 41b: NMOS transistor
42a, 42b: PMOS transistor
43a, 43b: conductor 44: contact hole
45, 47: polycrystalline silicon
46: gettering site hole 51: active region
52: gate electrode
53: isolation region
54: hole
55: gettering member 57: oxide film
58: electrode

SEMICONDUCTOR DEVICE AND SEMICONDUCTOR STORAGE DEVICE

BACKGROUND OF THE INVENTION

1. Field of the Invention

The present invention relates to a semiconductor device of silicon-on-insulator (SOI) structure comprising an insulation layer having a silicon layer provided thereon. Particularly, the present invention relates to a semiconductor device of an SOI structure having a gettering site.

2. Description of Related Art

During a process of manufacturing a semiconductor device, contaminants [for example, a metal contaminant; copper (Cu), iron (Fe), or nickel (Ni)] are sometimes introduced into a substrate at the time of fabrication of a semiconductor element or formation of contact holes. In the event that such contaminants are introduced into the substrate, the contaminants diffuse into element fabrication regions on the substrate through heat treatment in a subsequent stage. The contaminants disadvantageously deteriorate the characteristics of semiconductor elements fabricated in the respective element fabrication regions. For example, if a MOS transistor is fabricated on the substrate, the withstand voltage of a gate insulation film of the MOS transistor will be disadvantageously deteriorated. If a P/N-type impurity junction section is formed, a leakage current developing in the P/N-type impurity junction will be disadvantageously increased.

In the case of a semiconductor device employing a conventional bulk semiconductor substrate on which semiconductor elements are formed, gettering sites are formed on the reverse surface of the semiconductor substrate or the bulk semiconductor substrate, in order to prevent deterioration of characteristics of the semiconductor element, which would otherwise be caused by the contaminants. Gettering represents a technique of forming gettering sites, such as crystal defects, and fixedly capturing contaminants.

In a semiconductor device field today, from the view points of achieving higher-density configuration and higher-speed operation, attention is being given to an SOI substrate of SOI structure comprising a support substrate coated with a insulation layer and a silicon layer formed on the insulation layer, in lieu of a conventional bulk semiconductor substrate. In the case of the SOI substrate, even if gettering sites are formed on a support substrate corresponding to the conventional bulk semiconductor substrate, in order to cause the gettering sites to capture contaminants included in a silicon layer, the contaminants must pass through a insulation layer interposed between the silicon layer and the support substrates. Contaminants which do not have sufficient kinetic energy to pass through the insulation layer cannot be captured by the gettering sites. For this reason, the gettering technique becomes less effective for recently developed LSI manufacturing processes for forming an LSI circuit at a comparatively low temperature.

Japanese Patent Laid-Open Nos. Hei-4-72631 and 8-191140 describe a technique for forming gettering sites on the entire bottom surface of a silicon layer constituting an SOI substrate (hereinafter referred to as the "first gettering technique"). Further, Japanese Patent Laid-Open No. Hei-8-45943 describes a technique for gettering contaminants through use of a technique of forming a polycrystalline silicon layer, serving as a gettering site, so as to cover an element isolation region (hereinafter referred to as the "second gettering technique").

According to the first conventional gettering technique, gettering sites are formed on a silicon layer. In a case where an LSI circuit comprising a silicon layer having a thickness of 200 nm or less is manufactured, a leakage current develops across electronic elements fabricated on the surface of the silicon layer, thereby disadvantageously deteriorating the characteristics of a semiconductor device.

Further, the second conventional gettering technique overcomes a drawback of the first gettering technique but requires formation of a polycrystalline silicon layer, thus resulting in an increase in the size of an element isolation region where no elements are fabricated. Therefore, the second gettering technique represents a considerable obstacle against miniaturization of an LSI circuit.

In order to solve the problems, Japanese Patent Application Laid-Open No. Hei-5-82525 describes a technique of fragmentarily forming a insulation layer on a support substrate so as to establish electrical conduction between the silicon layer and the insulation layer such that contaminants are captured by gettering sites formed on the reverse surface of the support substrate. However, according to this technique, the insulation layer is fragmentarily formed in a phase of manufacturing an SOI wafer, whereby an SOI wafer having predetermined gettering sites is manufactured. This in turn places considerable restrictions on freedom of design of an LSI circuit.

Further, the gettering sites are formed on the reverse surface of the support substrate and are effective for preventing contamination of the support substrate from the reverse surface thereof. However, the gettering sites are formed at positions distant from a silicon layer serving as an active layer. Thus, this technique also involves difficulty in attaining a sufficient effect of preventing contamination of semiconductor elements fabricated on the silicon layer, which would otherwise be caused by contaminants.

SUMMARY OF THE INVENTION

The present invention has been conceived to solve the problems, and the object of the present invention is to provide a semiconductor device of SOI structure and a semiconductor storage device of SOI structure, which provide considerable freedom of design for an LSI circuit and enable sufficient gettering performance.

Further, the present invention relates to a semiconductor device of SOI structure and a semiconductor storage device of SOI structure, which enable formation of sufficient effective gettering sites and a reduction in the number of manufacturing processes.

According to a first aspect of the present invention, there is provided a semiconductor device comprising a semiconductor wafer of SOI structure which has a insulation layer and a silicon layer provided thereon, wherein the semiconductor wafer has a plurality of element fabrication regions where semiconductor elements are fabricated and a cutting region provided between the element fabrication regions, the semiconductor device has, in the cutting region, gettering sites which have grooves of a predetermined depth and gettering member embedding in the grooves.

According to a second aspect of the present invention, there is provided a semiconductor device comprising a semiconductor substrate of SOI structure which has a insulation layer and a silicon layer provided thereon; and memory cells provided on the semiconductor substrate, the semiconductor device has, around the memory cells, gettering sites which have grooves of a predetermined depth and gettering member embedding in the grooves.

According to a third aspect of the present invention, there is provided a semiconductor device comprising: a semiconductor substrate of SOI structure which has a insulation layer and a silicon layer provided thereon; a MOS transistor being provided on the silicon layer and having a gate electrode fabricated by way of a source/drain region and an gate insulation film; an interlayer insulation film being provided on the MOS transistor and at an elevated position with respect to the vicinity of the MOS transistor; a conductor being provided in the interlayer insulation film; and contact holes being provided in the interlayer insulation film so as to electrically connect the conductor to the source region or the drain region and being filled with a conductor, wherein the semiconductor device has, in the vicinity of the MOS transistor, gettering sites which have holes being formed so as to extend from a position above the interlayer insulation film to the inside of a silicon layer provided below the interlayer insulation film and gettering member embedding in the holes.

The above and other objects, effects, features and advantages of the present invention will become more apparent from the following description of the embodiments thereof taken in conjunction with the accompanying drawings.

BRIEF DESCRIPTION OF THE DRAWINGS

FIG. 6 is a top view schematically showing the upper surface of the semiconductor device according to the embodiment 2.

FIG. 7 is a partial top view showing a portion of the semiconductor device according to the embodiment 2.

FIG. 8 is a partial top view showing a portion of the semiconductor device according to the embodiment 2.

FIG. 9 is a cross-sectional view showing the semiconductor device according to the embodiment 3.

DETAILED DESCRIPTION OF THE PREFERRED EMBODIMENTS

Figure 1:
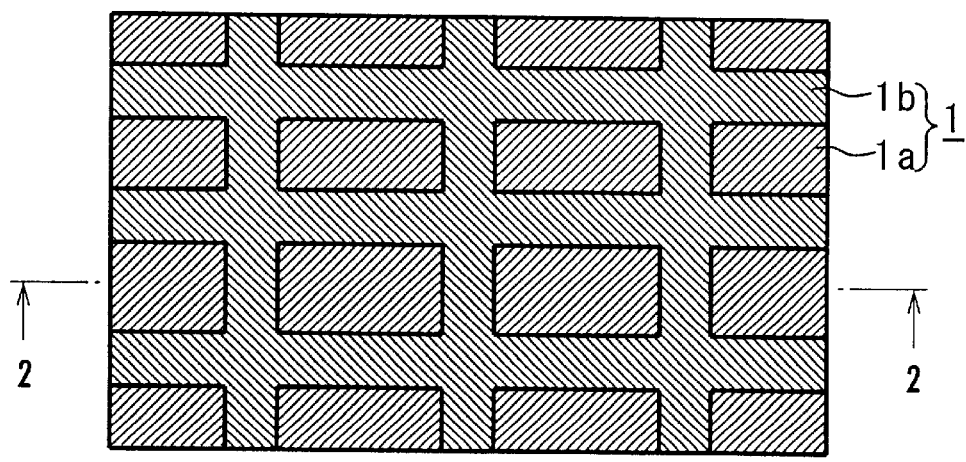
FIG. 1 is a partial top view showing a portion of the semiconductor device according to the embodiment 1.

Embodiments of the present invention will be described below with reference to the accompanying drawings. It is noted that the same reference symbols in the drawings denote the same or corresponding components.

Embodiment 1

Embodiment 1 is directed toward a semiconductor device comprising a semiconductor wafer of SOI structure, wherein grooves are formed in a cutting region on the semiconductor wafer, and the grooves are filled with a gettering member, to thereby form gettering sites in the cutting region.

Figure 2:
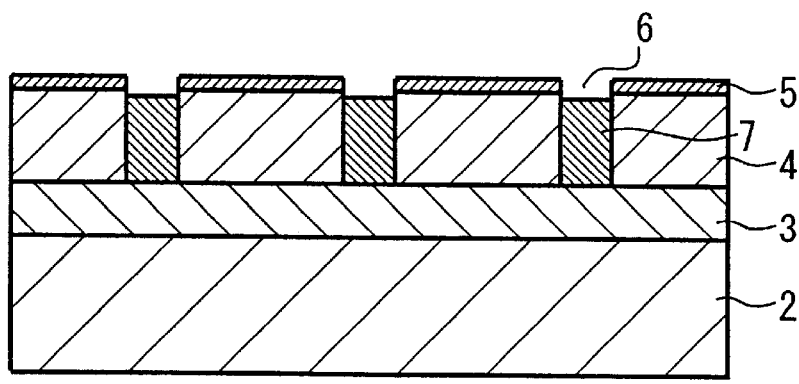
FIG. 2 is a cross-sectional view taken along line A—A shown in FIG. 1.

FIGS. 1 and 2 are schematic representations showing the structure of a semiconductor device according to the embodiment 1. FIG. 1 is a partial top view showing a portion of the semiconductor device according to the present embodiment; and FIG. 2 is a cross-sectional view taken along line 2—2 shown in FIG. 1, showing the structure of the semiconductor device shown in FIG. 1.

As shown in FIG. 1, a plurality of element fabrication regions 1*a* where semiconductor elements are actually fabricated are formed on the surface of a semiconductor wafer 1. A cutting region 1*b* used for separating semiconductor elements from the semiconductor wafer 1 is formed among the semiconductor elements. When actually separated, the semiconductor elements are cut along the cutting region 1*b*. Hence, the cutting region 1*b* must be given a predetermined width.

The width of the cutting region 1*b* is determined by the thickness of cutting teeth used for slicing the semiconductor wafer 1, and is usually set to 10 to 100 $\mu$m. The configuration of the cutting region 1*b* is designed according to a semiconductor element fabricated on the semiconductor wafer 1. As shown in FIG. 1, the cutting region 1*b* is formed into a grid pattern.

As shown in FIG. 2, a semiconductor device shown in FIG. 1 has the semiconductor wafer 1 of SOI structure. The semiconductor wafer 1 comprises a support substrate 2, such as a silicon substrate; a insulation layer 3 formed from a silicon oxide film, or a like film, on the support substrate 2; and a silicon layer 4 which is laid on the insulation layer 3 and serves as an active layer. In the semiconductor wafer 1, the insulation layer 3 has a thickness of 50 nm to 1 $\mu$, and the silicon layer 4 has a thickness of 50 to 300 nm.

Within the cutting region 1*b* in the silicon layer 4 of the semiconductor wafer 1, the grooves 6 are formed and is filled with a gettering member 7, thus constituting gettering sites. Polycrystalline silicon is commonly used as the gettering member 7, but silicon oxide may also be used.

The depth of the groove 6 may be set so that the bottom of the groove 6 extend to a position within the silicon layer 4, the insulation layer 3, or the support substrate 2. The deeper the grooves 6, the greater the capacity of the gettering sites, and hence deeper grooves 6 are desirable. However, formation of the grooves 6 only within the silicon layer 4 is most simple.

Figure 3A:
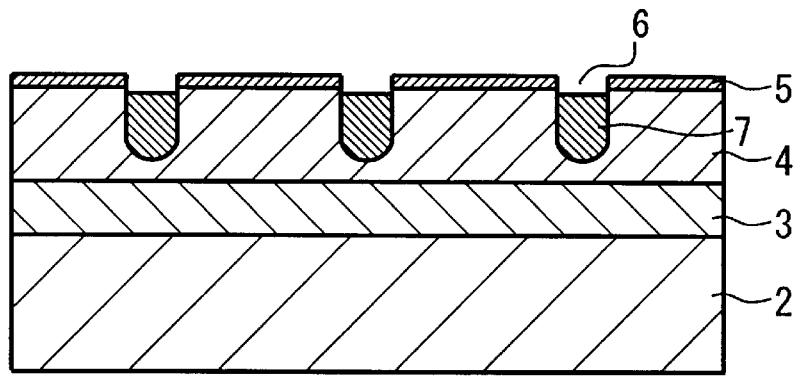
FIGS. 3A–3C are a partial top view showing a portion of the semiconductor device according to the embodiment 1.
Figure 3B:
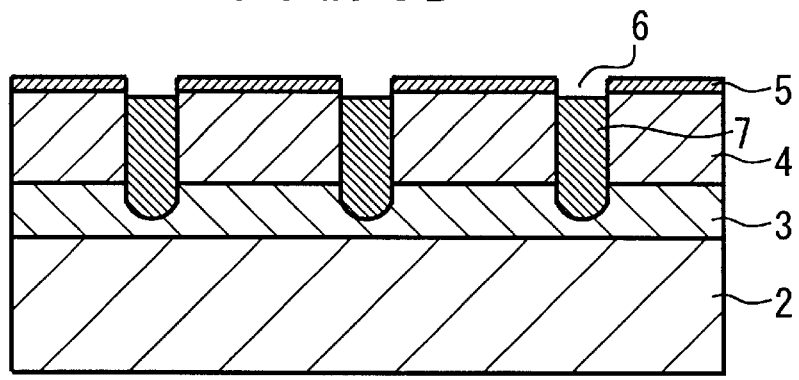
Figure 3C:
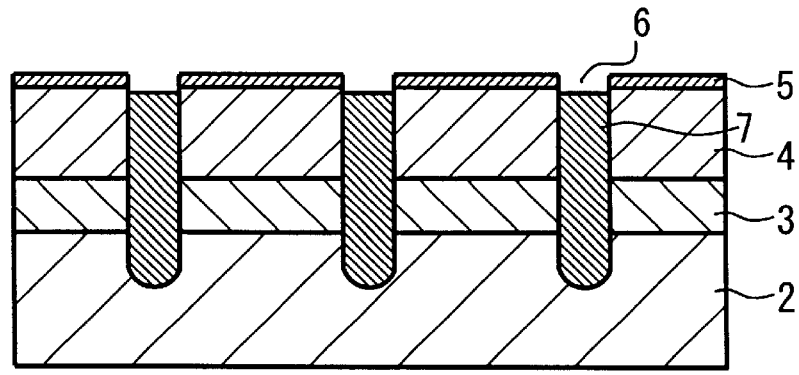

As shown in FIGS. 3A to 3C, the most desirable profile of the bottom surfaces of the grooves 6 is a downwardly-protruding conical shape. When the grooves 6 are formed through lower-power plasma etching, such a conical profile can mitigate damage to the grooves 6, which would otherwise be by caused by plasma. Further, when the grooves 6 are filled with insulation substance, the conical profile can mitigate stress acting between the grooves 6 and the silicon layer 4. As a result, crystal defects, which would otherwise arise in the silicon layer 4 due to the stress exerted on the same, can be prevented. As mentioned above, since there can be prevented generation of crystal defects, which would be caused in association with generation of a gettering site, gettering sites can be formed at positions very close to the active region.

In a case where a trench isolation structure is formed by embedding insulation substance in a region for isolating semiconductor elements fabricated in the respective element fabrication regions 1a of the semiconductor wafer 1, trenches can also be formed in conjunction with formation of the grooves, thus diminishing the number of manufacturing processes. In such a case, desirably the grooves and the trenches are formed to the same depth. More desirably, the grooves are formed such that the bottom of the grooves extend to the insulation layer.

Figure 4A:
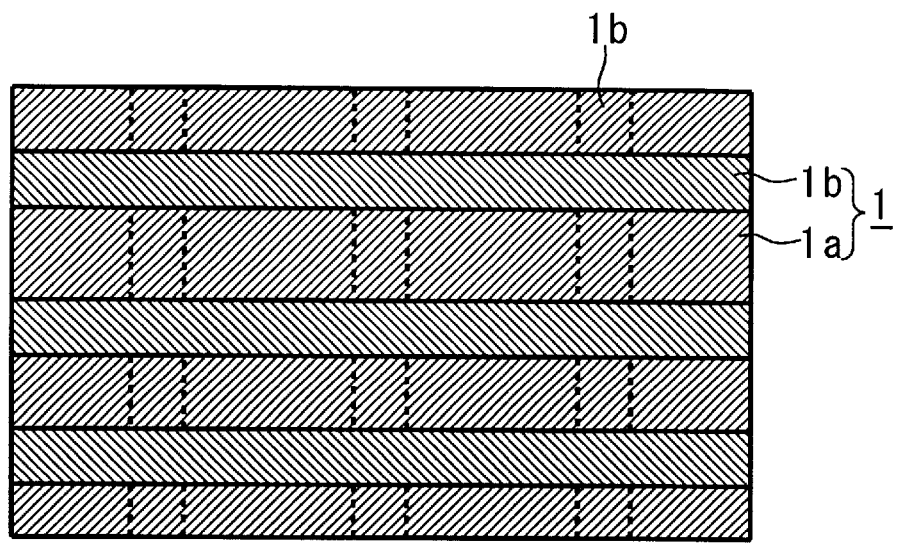
FIGS. 4A–4B are a cross-sectional view showing a portion of the semiconductor device according to the embodiment 1.
Figure 4B:
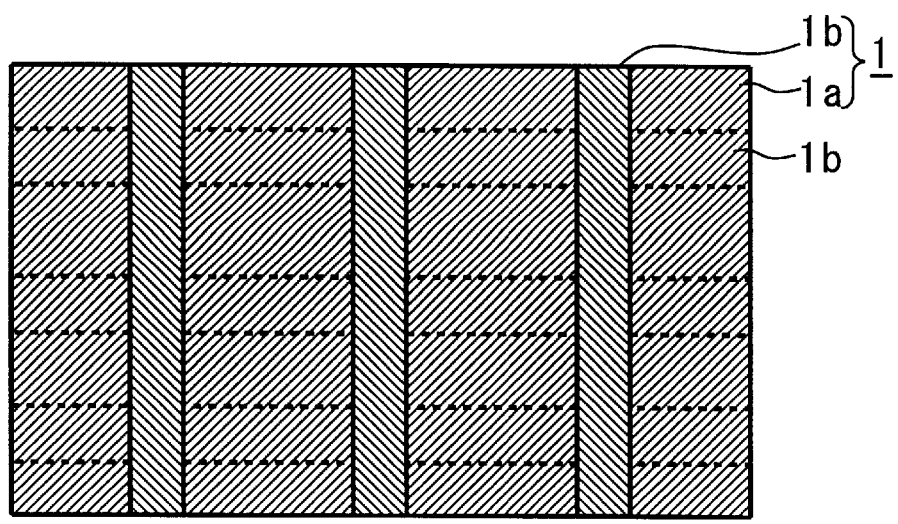

If the gettering sites are formed over the entire cutting region 1b shown in FIG. 1, the capacity of the gettering site is increased further. However, no particular limitation is placed on formation of the gettering site. As shown in FIGS. 4A and 4B, the gettering site may be formed arbitrarily, such as in only a longitudinal or lateral direction, so long as they are formed within the cutting region 1b. Further, although the grooves assume linear form in both FIG. 1 and FIGS. 4A and 4B (where the groove shown in FIG. 1 also includes ring-shaped grooves), no particular limitation is placed on the geometry of the grooves. The grooves may be formed at given intervals, or a plurality of hole-shaped gettering sites may also be formed.

Next, a method of manufacturing a semiconductor device shown in FIG. 1 will now be described.

FIGS. 5A to 5D are cross-sectional views, showing a method of manufacturing the semiconductor device shown in FIG. 1.

Figure 5A:
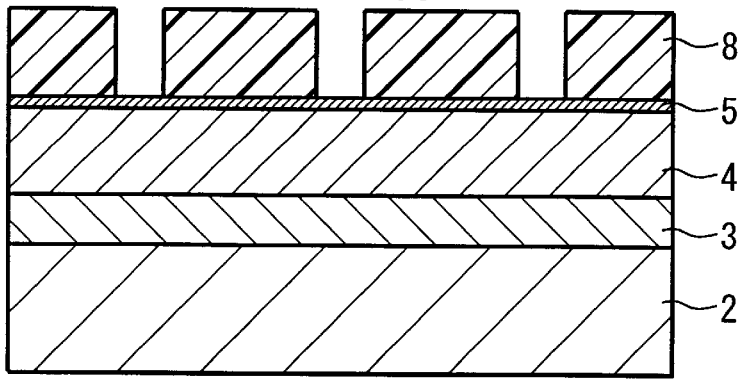
FIGS. 5A to 5D are cross-sectional views, showing a method of manufacturing the semiconductor device shown in FIG. 1.

First, the semiconductor wafer 1 of SOI structure is prepared, and a protective film 5 is formed from a silicon oxide film or a silicon nitride film on the semiconductor wafer 1. A semiconductor wafer of SOI structure manufactured by a known method is used for the semiconductor wafer 1. Subsequently, a photoresist film 8, on which openings are formed in a predetermined pattern, is formed on the semiconductor wafer 1. As shown in FIG. 5A, the pattern of the photoresist film 8 is formed such that a region where gettering sites are to be formed is opened; more specifically, such that the cutting region 1b shown in FIG. 1 is opened. In the embodiment 1, the pattern is formed such that openings are formed within the cutting region 1b to a width of 2 to 3 $\mu$m.

Figure 5B:
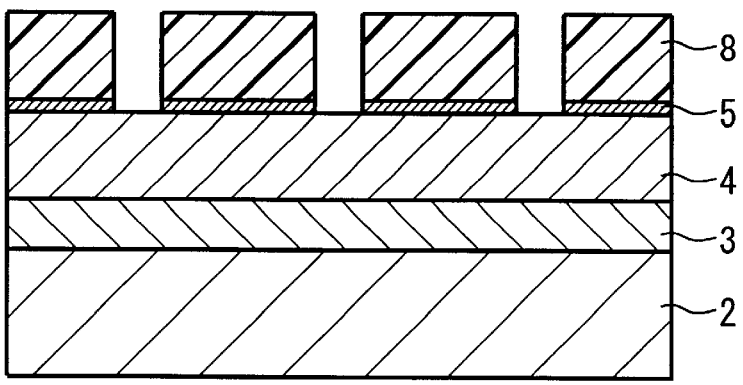
Figure 5C:
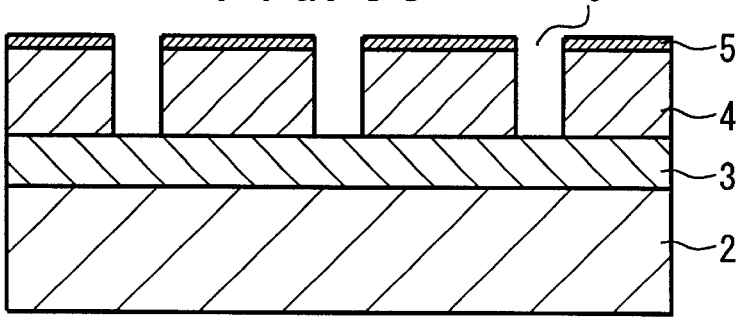

Subsequently, as shown in FIG. 5B, the pattern is transferred to the protective film 5 through plasma etching or by means of chemical etching employing chemicals. After removal of the photoresist film 8, the semiconductor wafer 1 is subjected to plasma etching, so that the grooves 6 used for forming gettering sites are formed to a width of about 2 to 3 $\mu$m within the cutting region 1b of the silicon layer 4, as shown in FIG. 5C. Conditions for plasma etching employed for forming the grooves 6 may be changed according to the depth of the grooves 6 to be formed, as required. Generally, plasma etching is performed at a pressure of 10 mtorr to 1 torr, a voltage of 5 to 20 V, and a substrate temperature of −50 to 300° C. As a result of the silicon wafer 1 being subjected to plasma etching under such conditions, the bottom surfaces of the grooves 6 can be formed into a conical profile.

As mentioned above, in a case where the gettering sites and the trench isolation structure are formed simultaneously, the trench isolation structure is usually set such that the bottoms of the trenches of the trench isolation structure extend to the insulation layer. At this time, the grooves are formed such that the bottoms of the grooves extend to the inside of the insulation layer.

After formation of the grooves 6, a polycrystalline silicon film 7 is deposited on the groove 6 through CVD. Subsequently, the polycrystalline silicon film 7 is eliminated from the top of the silicon layer 4 through plasma etching or chemical-mechanical polishing (CMP), with the result that the silicon wafer 1 assumes a form such as that shown in FIG. 5D.

Here, in a case where a trench isolation structure having polycrystalline silicon embedded therein is formed, there can be simultaneously performed a process of filling the trench with polycrystalline silicon and a process of embedding the polycrystalline silicon film.

As mentioned above, after formation of the gettering sites, semiconductor elements including a MOS transistor, such as DRAM or SRAM, are fabricated in the respective element fabrication regions 1a on the semiconductor wafer 1 by means of a known method. After fabrication of the semiconductor elements, the semiconductor wafer 1 is sliced along the cutting region 1b, to thereby separate the semiconductor elements from the semiconductor wafer 1. Thus, the individual semiconductor elements are produced.

In the embodiment 1, memory, such as DRAM or SRAM, is mentioned as a semiconductor element. However, the semiconductor element is not particularly limited to such memory. The semiconductor element may be any element, so long as the element is a semiconductor element; a MOS transistor or a bipolar transistor, such as a random logic circuit of a microcomputer unit, or a CCD.

In the semiconductor device according to the embodiment 1, gettering sites of large capacity are formed in the cutting region of the semiconductor wafer, thus enabling sufficient gettering performance.

Further, since the gettering sites are formed within the silicon layer, the gettering sites are located at positions close to an active layer, thereby improving gettering performance.

The gettering sites can be formed over the entire SOI wafer so as to surround the semiconductor elements uniformly fabricated in the respective element fabrication regions, thereby preventing the semiconductor elements from being contaminated by contaminants.

The gettering sites can be formed without regard to the type, scale, or design of a semiconductor element to be fabricated in the element fabrication regions.

Since the gettering site can be formed simultaneous with formation of the trench isolation structure, a semiconductor device can be formed without addition of a new process for forming gettering sites.

Embodiment 2

Embodiment 2 is directed to a semiconductor device comprising: a semiconductor substrate of SOI structure; memory cells; peripheral circuits spaced a predetermined distance apart from the memory cells; grooves formed around the memory cells (along a region between the memory cells and the peripheral circuits); and gettering sites which are formed in the grooves by filling the inside of the grooves with a gettering member.

FIG. 6 is a top view schematically showing the upper surface of the semiconductor device according to the embodiment 2, showing the semiconductor device comprising a peripheral groove which is filled with a gettering member and is placed in a ring-shaped pattern along the outer periphery of a DRAM memory cell block (i.e., a region between sense amplifiers and decoders).

As shown in FIG. 6, a semiconductor substrate of SOI structure (hereinafter often referred to as an "SOI semiconductor substrate") comprises a support substrate formed from a silicon substrate or a like substrate; a insulation layer which is formed from a silicon oxide film and is placed on the support substrate; and a silicon layer which is placed on the insulation layer and serves as an active layer. On the SOI semiconductor substrate, there are formed a memory cell block 22, in which a plurality of memory cells 21 for storing data are fabricated; and peripheral circuits 23 and 24 which are formed outside the memory cell block 22 so as to be spaced a predetermined distance apart from the outer periphery of the memory cell block 22. The peripheral circuits 23 correspond to sense-amplifier circuits 23 which sense minute output signals flowing through bit lines of the memory cells 21 and amplify the thus sensed output signals. The peripheral circuits 24 correspond to decoder circuits 24 for designating a memory cell to be activated. On the SOI semiconductor substrate, the insulation layer is formed to a thickness of 50 nm to 1 µm, and the silicon layer is formed to a thickness of 50 to 300 nm. The distance between the memory cell block 22 and the peripheral circuits 23 and 24 may be changed according to design but is usually set to a value of 0.5 to 1 µm.

Grooves 25 are formed in a region between the memory cell block 22 and the peripheral circuits 23 and 24, and in a region of the memory cell block 22 such as between the N type dopant region and P type dopant region, and a gettering member is embedded in the grooves 25, thereby forming gettering sites. Polycrystalline silicon is usually used as the gettering member, but oxide silicon may also be used. As in the case of the embodiment 1, the depth of the grooves may be set such that the bottoms of the grooves extend to the inside of the silicon layer, that of the insulation layer, or that of the support substrate.

As shown in FIG. 6, when the gettering sites are formed in a ringshaped pattern so as to surround the memory block 22, thereby ensuring a greater area for the gettering sites and better gettering performance. However, formation of the gettering sites in a ring-shaped pattern makes it difficult to electrically connect the memory cells 21 to the peripheral circuits 23 and 24. To avoid such a difficulty, as shown in FIG. 7, linear gettering sites may be fragmentarily formed along the periphery of the memory cell block 22 such that the memory cells 21 are electrically connected to the peripheral circuits 23 and 24 by way of the regions where no gettering sites are formed. As mentioned above, instead of gettering sites being formed in a linear shape or ring-shaped profile, the gettering sites may be formed into an arbitrary shape; e.g., a circular shape, as shown in FIG. 8.

Next, there will be described a method of manufacturing a semiconductor device shown in FIG. 6.

First, as in the case of the embodiment 1, a semiconductor wafer of SOI structure is prepared, and a protective film is formed on the semiconductor wafer. Subsequently, a photoresist film, in which openings are formed in a predetermined pattern, is formed on the semiconductor wafer through use of photolithography. The photoresist film is formed such that the openings are located at positions where gettering sites are to be formed. However, in contrast with the case of the embodiment 1, the photoresist film is formed such that the openings are located in an area between the element fabrication region where the memory cells 21 are formed and regions where the peripheral circuits 23 and 24 are fabricated. More specifically, the openings are formed so as to surround the memory cell block 22. In the embodiment 2, ring-shaped grooves are formed in the area to a width of 2 to 3 µm.

Figure 5D:
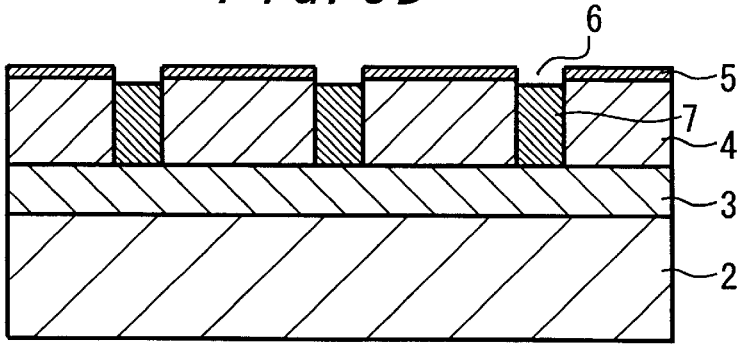

As in the case of processing shown in FIGS. 5B to 5D according to the embodiment 1, a gettering member is embedded in the ring-shaped grooves, thus constituting gettering sites.

After formation of the gettering sites, MOS transistors and capacitors are fabricated within a memory cell fabrication region in the element fabrication region (i.e., a region surrounded by the gettering sites), and the sense amplifiers 23 and the decoders 24 are formed within a peripheral circuit fabrication region within the element fabrication region.

Although the embodiment 2 has described the DRAM memory cell, the present invention is not particularly limited to the DRAM memory cell and may be applied to any memory cell, so long as the memory cell has a region, where gettering sites can be formed, between a memory cell block, SRAM or flash memory, and peripheral circuits.

Although in the embodiment 2 sense amplifiers and decoders are mentioned as peripheral circuits, the present invention is not limited to them. The peripheral circuits may correspond to electronic circuits provided around memory cells, such as a power circuit, fuses, driver circuits, frequency modulation circuits, or buffer circuits.

In the semiconductor device according to the embodiment 2, gettering sites can be formed in a region between the memory cells and the peripheral circuits, thus ensuring a large gettering capacity for gettering sites and enabling sufficient gettering performance.

The gettering sites are formed over the SOI substrate so as to surround the memory cells, with the result that the memory cells or semiconductor elements, such as peripheral circuits, can be reliably protected from contaminants such as metal impurities. More specifically, there is yielded a great effect of preventing diffusion of contaminants to channels along which electrons are input or output to memory cells, such as channels between the memory cells, channels between memory cells and wiring patterns (contact holes), and channels between the sources and drains of transistors.

Further, since the gettering sites are formed within the silicon layer, the gettering sites are formed at positions close to an active layer, thus improving gettering performance.

Since gettering sites can be formed simultaneous with formation of a trench isolation structure, a semiconductor device can be fabricated without addition of a new process for forming gettering sites.

Although the first and embodiment 2s have described an example in which only one type of gettering member is embedded in the grooves, the number of types of gettering member is not limited to one. For example, a plurality types of gettering member can e embedded in a plurality of gettering sites: silicon oxide is embedded as a gettering member in a groove, whose bottom extends to the inside of the silicon layer, to thereby constitute gettering sites; or polycrystalline silicon is embedded as a gettering member in a groove whose bottom extends to the inside of the insulation layer, to thereby constitute gettering sites.

Gettering sites may also be formed by forming a thermal oxide film on the side walls of the grooves by heating the grooves; and by embedding polycrystalline silicon in the grooves.

Embodiment 3

The present embodiment is directed toward a semiconductor device with a memory cell of DRAM, the memory cell including: a MOS transistor formed within a silicon layer placed on an SOI substrate; storage node electrodes provided on the MOS transistor by way of an interlayer insulation film; and capacitors which are provided opposite the storage node electrodes and include an upper electrode, wherein holes are formed in the vicinity of the MOS transistor so as to extend from the interlayer insulation film to the inside of a silicon layer provided below the interlayer insulation film, and a gettering member is embedded into the holes, to thereby constitute gettering sites. The semiconductor device according to the embodiment 3 has a structure which enables formation of holes for use as gettering sites simultaneous with formation of contact holes for use as storage nodes.

FIG. 9 is a cross-sectional view showing the semiconductor device according to the embodiment 3. In this semiconductor device, gettering sites are formed by opening contact holes for use as DRAM storage nodes simultaneous with formation of holes in the interlayer insulation film; and by embedding polycrystalline silicon in the contact holes.

As shown in FIG. 9, the semiconductor storage device according to the embodiment 3 comprises a semiconductor substrate of SOI structure. This semiconductor substrate comprises a support substrate 2, such as a silicon substrate; a insulation layer 3 which is formed from a silicon oxide film or like film and is laid on the support substrate 2; and a silicon layer 4 which is laid on the insulation layer 3 and acts as an active layer. In this semiconductor substrate, the insulation layer 3 has a thickness of 50 nm to 1 $\mu$m, and the silicon layer 4 has a thickness of 50 to 300 nm.

In active regions 4a in the silicon layer 4 on the semiconductor substrate, a source/drain region and a gate electrode, which is formed on an active region in the source/drain region via a gate oxide film, are formed to thereby fabricate a MOS transistor.

On the silicon layer 4 including the active region 4a in which the MOS transistor is fabricated, interlayer insulation films 31a and 31b are formed from silicon oxide, and storage node electrodes 32 constituting lower electrodes of capacitors are provided on the interlayer insulation film 31. Storage node contact holes 33 are formed in the interlayer insulation film 31 so as to be able to electrically connect the storage node electrodes 32 to the source or drain region of the MOS transistor. A conductor 34 is embedded in each of the storage node contact holes 33. Reference numeral 35 designates a bit line interposed between the interlayer insulation films 31a and 31b.

Contact holes 36 are formed in an area, where no elements are fabricated, in the interlayer insulation film 31 in the vicinity of the MOS transistor. Gettering sites are formed by embedding a gettering member 37 in the contact holes 36. Although polycrystalline silicon is usually used as the gettering member 37, silicon oxide may also be used. As in the case of the grooves according to the embodiment 1, the bottoms of the contact holes 36 may be set so as to extend to the inside of the silicon layer 4, that of the insulation layer 3, or that of the support substrate 2.

An upper electrode 38 is formed on and opposite the storage node electrodes 32 with a insulation film or a high insulation film present therebetween. A capacitor is constituted of these opposing electrodes and constitutes DRAM together with the previously-described MOS transistor.

A method of manufacturing a semiconductor device shown in FIG. 9 is now described.

After a MOS transistor has been fabricated on the SOI substrate through use of a known DRAM manufacturing method, an interlayer insulation film 31 is formed from a silicon oxide film on the silicon layer 4 including the MOS transistor (the interlayer insulation film 31 is constituted of the two layers 31a and 31b according to a known method, and a bit line is formed on the first interlayer insulation layer 31a according to a known method).

Figure 10A:
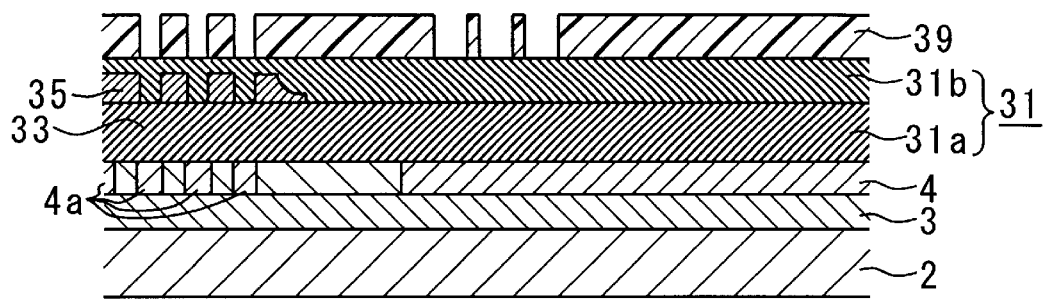
FIGS. 10A–10D show a method of manufacturing a semiconductor device shown in FIG. 9.

As mentioned above, after formation of the interlayer insulation film 31, a photoresist film 39 is applied to the upper surface of the interlayer insulation film 31. Through use of photolithography, a photoresist film 39, in which openings are formed in a predetermined pattern, is formed on the interlayer insulation film 31. As shown in FIG. 10A, the openings are formed into such a pattern that there are opened regions where the storage node contact holes 33 are to be formed and regions where gettering site holes are to be formed; more specifically, such that the storage node contact holes and regions—which are in the vicinity of the MOS transistor and where no elements are to be fabricated—are opened. In the embodiment 3, openings are formed to a diameter of 0.1 to 1.0 $\mu$m within the region where no elements are to be fabricated.

Figure 10B:
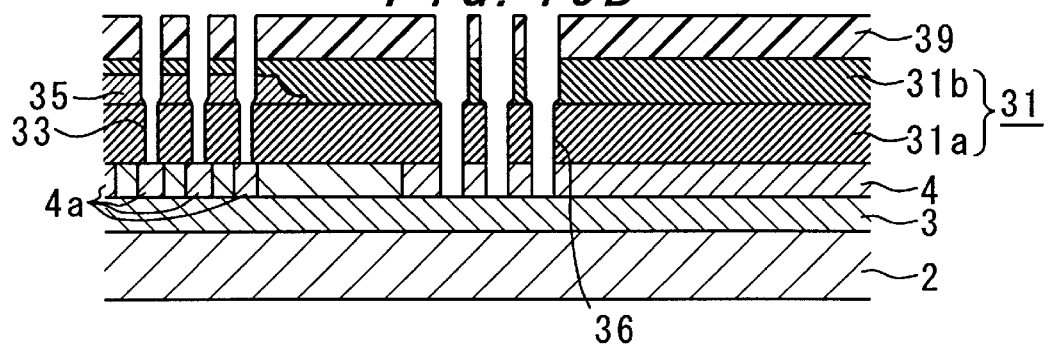

Subsequently, as shown in FIG. 10B, the silicon substrate is subjected to plasma etching under conditions suitable for the structure of an interlayer insulation film directly below the openings of the resist film. Openings are formed so as to extend to the insulation layer 3 on the SOI substrate, thus eliminating the photoresist film 39. As a result, the SOI substrate assumes a cross section such as that shown in FIG. 10B. The holes 36 are formed so as to assume a diameter of about 0.1 to 1.0 $\mu$m. Here, the holes 36 are formed such that the bottoms of the holes 36 become flush with the bottom surface of the silicon layer 4.

Figure 10C:
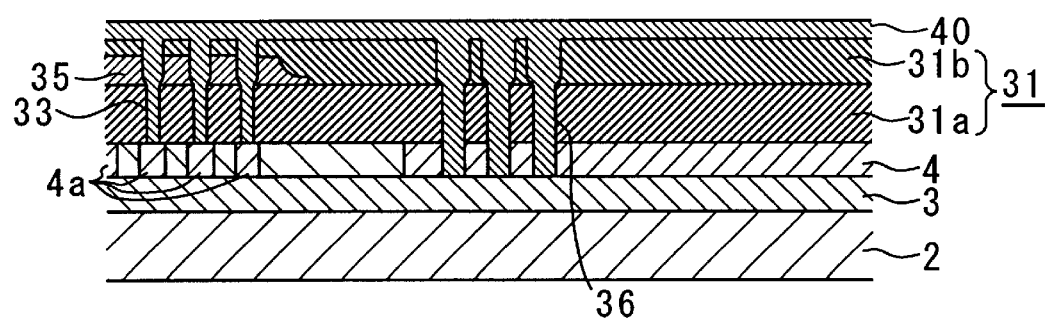
Figure 10D:
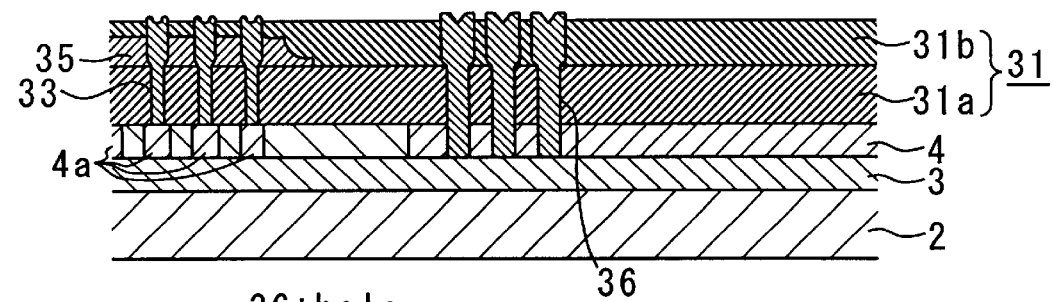

After formation of the storage node contact holes 33 and the gettering site holes 36, a polycrystalline silicon film 40 is deposited by means of CVD, as shown in FIG. 10C. Subsequently, the polycrystalline silicon film 40 is eliminated from the interlayer insulation film 32 through chemical-mechanical polishing (CMP), whereby gettering sites are formed, as shown in FIG. 10D.

After formation of the gettering sites, the storage node electrodes 32, which are to act as lower electrodes of the capacitor, are formed on the respective storage node contact holes 33 filled with a conductor. The upper electrode 38 is formed on and opposite the lower electrodes 32 with a insulation film or a high insulation film interposed therebetween, thus fabricating a DRAM cell.

In the semiconductor storage device according to the embodiment 3, gettering sites are not formed in only the silicon layer of the SOI substrate but are formed so as to extend from the interlayer insulation film formed on the SOI layer to the silicon layer, thus increasing the capacity of the gettering sites.

Further, the gettering site holes and the storage node contact holes to be formed during the process of manufacturing a DRAM cell can be formed simultaneously, so that gettering sites can be formed without an increase in the number of manufacturing processes.

Gettering sites are formed through creation of holes, and hence the area of a region where the gettering sites are formed can be reduced. Further, gettering sites can be formed in the vicinity of a MOS transistor. In the event of damage to the SOI substrate (i.e., occurrence of crystal defects) or introduction of contaminants, which would be caused by etching of a contact hole, the contaminants can be immediately captured, thus enabling highly-efficient gettering performance.

Embodiment 4

The gettering sites referred in connection with the embodiment 3 are formed by opening holes so as to extend from the interlayer insulation film of the DRAM cell to the silicon layer of the SOI substrate, and by embedding a gettering member in the holes. In contrast, gettering sites according to a embodiment 4 are formed by opening holes so as to extend from the interlayer insulation film of an SRAM cell to the silicon layer of the SOI substrate, and by embedding a gettering member into the holes.

Figure 11:
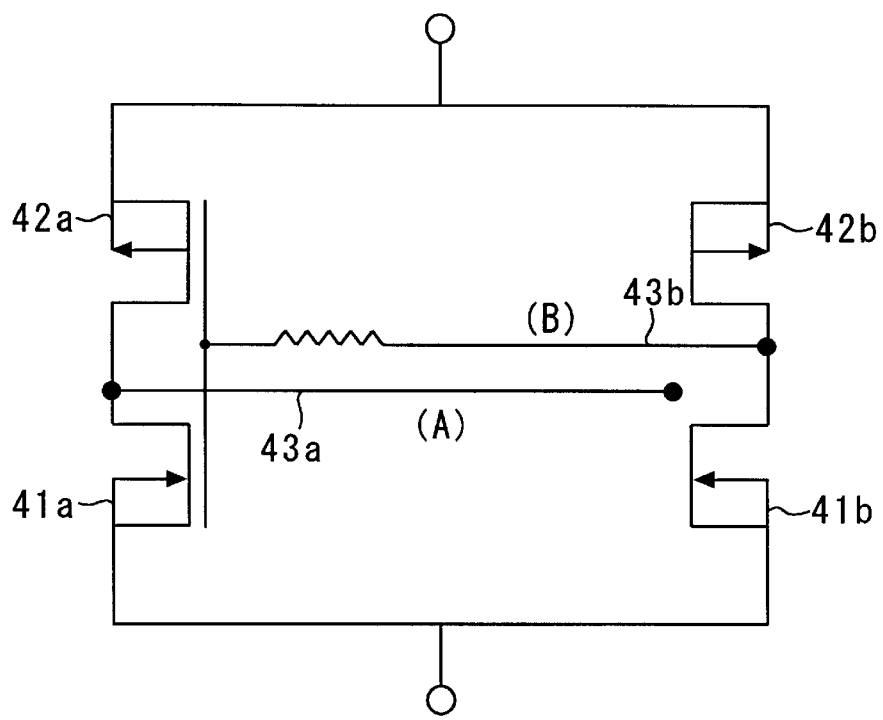
FIG. 11 is a schematic representation showing the principal elements of such a SRAM memory cell according to the embodiment 4.

An SRAM memory cell usually comprises six elements (transistors) for statically retaining data. FIG. 11 is a schematic representation showing the principal elements of such a SRAM memory cell. As shown in the drawing, the SRAM memory cell basically comprises cross-coupled latch circuits (NMOS transistors 41a and 41b) and access transistors (not shown). FIG. 11 shows the structure of a CMOS cell, wherein PMOS transistors 42a and 42b act as loads.

Figure 12:
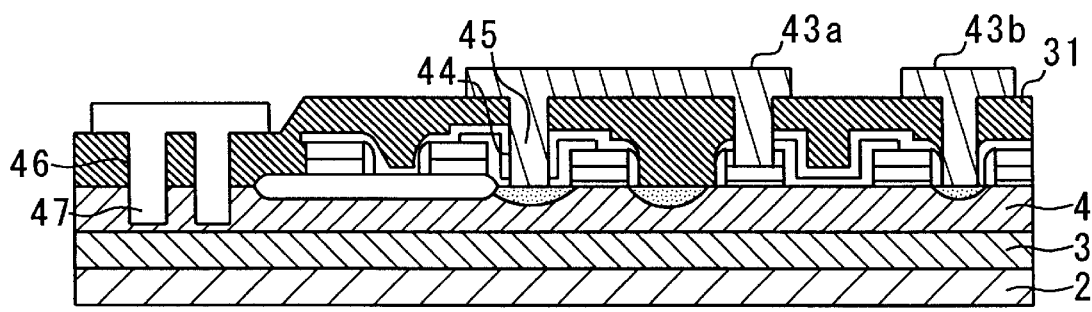
FIG. 12 is a cross-sectional view showing a semiconductor device according to the embodiment 4.

FIG. 12 is a cross-sectional view showing a semiconductor device according to the embodiment 4; specifically, the semiconductor device when the principal circuits of the SRAM memory cell shown in FIG. 11 are fabricated on a semiconductor substrate of SOI structure. As shown in FIG. 12, the semiconductor substrate of SOI structure comprises the support substrate 2 formed from a silicon substrate; the insulation layer 3 which is formed from a silicon oxide film on the support substrate 2; and the silicon layer 4 which is formed on the insulation layer 3 and serves as an active layer. In the semiconductor substrate, the insulation layer 3 assumes a thickness of 50 nm to 1 $\mu$m, and the silicon layer 4 assumes a thickness of 50 to 300 nm.

As shown in FIG. 11, the NMOS transistors 41a and 41b, which constitute a latch circuit, and the PMOS transistors 42a and 42b, which act as loads, are fabricated in the silicon layer 4 of the SOI substrate. The interlayer insulation film 31 is formed on the semiconductor element. Further, a conductor 43a which is to act as a storage node (A) and a conductor 43b which is to act as a storage node (B) are formed on the interlayer insulation film 31. Contact holes 44 are formed in the interlayer insulation film 31 and are filled with a conductor 45 such that the conductors 43a and 43b, the NMOS transistors 41a and 41b, and the PMOS transistors 42a and 42b are electrically connected, as shown in FIG. 11.

Holes 46 are formed in an area of the interlayer insulation film 31 which is in the vicinity of the MOS transistor and in which no elements are formed. A gettering member 47 is embedded into the holes 46, thus constituting gettering sites. Although polycrystalline silicon is usually used as the gettering member, silicon oxide may also be used. As in the case of the grooves according to the embodiment 1, the bottoms of the holes 46 may be set so as to extend to the inside of the silicon layer 4, that of the insulation layer 3, or that of the support substrate 2.

A method of manufacturing a semiconductor device shown in FIG. 12 is now described.

After NMOS transistors, which constitute latch circuits, and PMOS transistors, which act as loads, have been fabricated on the SOI substrate through use of a known SDRAM manufacturing method, the interlayer insulation film 31 is formed from a silicon oxide film on the silicon layer 4 including the MOS transistors.

As mentioned above, after formation of the interlayer insulation film 31, a photoresist film is applied to the upper surface of the interlayer insulation film 31. Through use of photolithography, a photoresist film, in which openings are formed in a predetermined pattern, is formed on the interlayer insulation film 31. The openings are formed into such a pattern that there are opened regions on the interlayer insulation film 31 where contact holes 44 are to be formed and regions on the interlayer insulation film 31 where gettering site holes 46 are to be formed; specifically such that the conductors 43a and 43b, which serve as storage nodes, and the source/drain regions or gate electrodes of the NMOS transistors 41a and 41b and those of the PMOS transistors 42a and 42b are electrically connected together.

Subsequently, as in the case of the embodiment 4, after formation of the contact holes and the gettering site holes 46, polycrystalline silicon 45 and polycrystalline silicon 47 are embedded into the respective contact holes 44 and the gettering site holes 46, thus constituting gettering sites. Subsequently, the conductors 43a and 43b, which serves as storage nodes, are formed on the respective contact holes 44 by means of a known method, thus constituting the SRAM cell.

In the semiconductor storage device according to the embodiment 4, gettering sites are not formed in only the silicon layer of the SOI substrate but are formed so as to extend from the interlayer insulation film formed on the SOI layer to the silicon layer, thus increasing the gettering capacity of the gettering sites.

Further, the gettering site holes and the storage node contact holes to be formed during the process of manufacturing a DRAM cell can be formed simultaneously. Therefore, gettering sites can be formed without an increase in the number of manufacturing processes.

Gettering sites are formed through opening of holes, and hence the area of a region of the gettering sites can be reduced. Further, gettering sites can be formed in the vicinity of a MOS transistor. In the event of damage to the SOI substrate (i.e., occurrence of crystal defects) or introduction of contaminants, which would be caused by etching of a contact hole, the contaminants can be immediately captured, thus enabling highly-efficient gettering performance.

Embodiment 5

The present embodiment is directed toward a semiconductor device, wherein gettering sites are formed in a silicon layer within a field shield isolation region on the SOI substrate. The field shield isolation region corresponds to a region in the vicinity of an active region where a source/drain region of a MOS transistor is formed. An oxide film is formed on the silicon layer of the field shield isolation region, and an electrode is formed on the oxide film. By application of a voltage to the electrode, electrons or positive holes existing in the vicinity of the field shield isolation region are captured.

Figure 13:
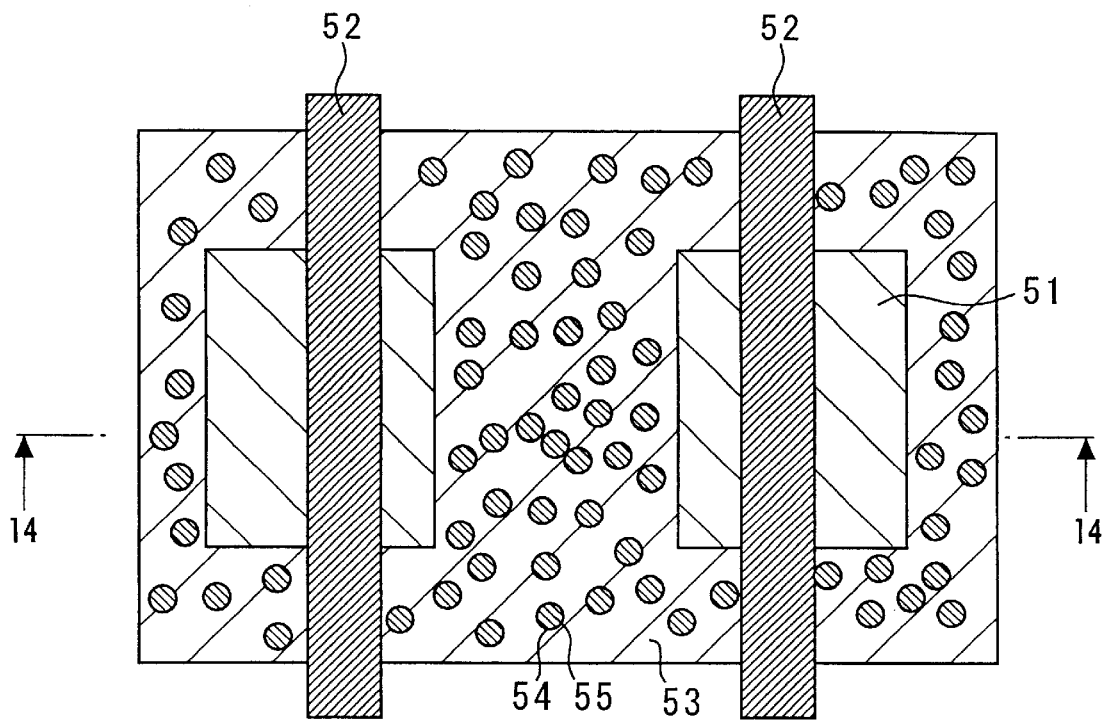
FIG. 13 shows the semiconductor device according to the embodiment 5 when viewed from the top.
Figure 14:
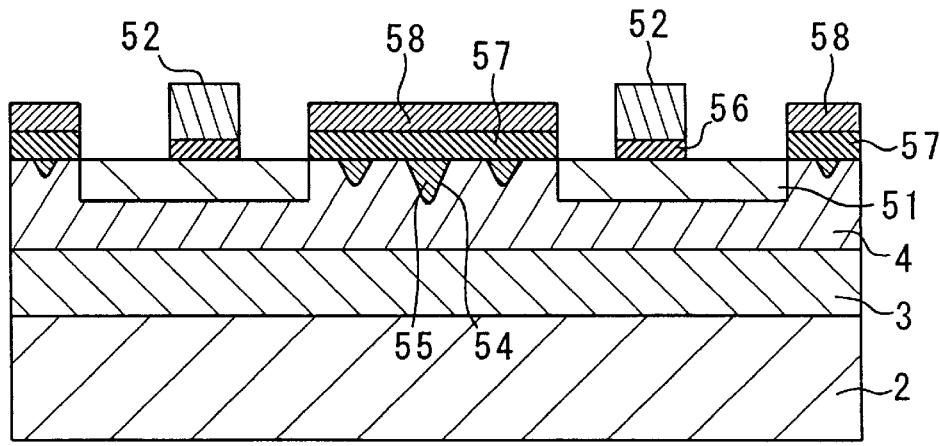
FIG. 14 is a cross-sectional view of the semiconductor device taken along line X—X shown in FIG. 13.

FIGS. 13 and 14 show a semiconductor device according to the embodiment 5. FIG. 13 shows the semiconductor device when viewed from the top, and FIG. 14 is a cross-sectional view of the semiconductor device taken along line 14—14 shown in FIG. 13. For brevity, descriptions about an oxide film and an electrode, which would be formed on a field shield isolation region 53, are omitted.

As shown in FIG. 13, two active regions 51 are formed on the SOI substrate so as to be spaced a given distance apart from each other. Further, gate electrodes 52 are formed on the respective active regions 51, by way of a gate oxide film 56. A MOS transistor is constituted of the gate electrodes 52 and the active regions 51, which act as source/drain regions. Further, gettering sites are formed in the silicon layer 4 within the field shield isolation region 53 in the vicinity of the active regions 51, by embedding a gettering member 55, such as a polycrystalline silicon, into holes 54.

As shown in FIG. 14, the semiconductor device has an SOI structure and comprises the support substrate 2 formed from a silicon substrate; the insulation layer 3 which is formed from a silicon oxide film on the support substrate 2;

and the silicon layer 4 which is formed on the insulation layer 3 and serves as an active layer.

In the silicon layer 4 of the SOI semiconductor substrate, the active regions 51 doped with impurities are spaced a given distance apart from each other, and an oxide film 57 is formed on the silicon layer 4 within the field shield isolation region 53 in the vicinity of the active regions 51. Electrodes 58 are formed on the oxide film 57. In the SOI semiconductor substrate, the insulation layer 3 assumes a thickness of 50 nm to 1 µm, and the silicon layer 4 assumes a thickness of 50 to 300 nm. The distance between the active regions is changed according the design of the semiconductor device, as required. Usually, the distance assumes a value of 0.5 to 1 µm.

Gettering sites are formed by opening the holes 54 in the vicinity of the active regions 51 where those MOS transisitors are formed, and by embedding the gettering member 55 in the holes 54. Although polycrystalline silicon is usually used as the gettering member 55, silicon oxide may also be used. Further, the bottoms of the holes 54 may be set so as to extend to the inside of the silicon layer 4. The reason for this is that if the grooves 54 are formed so as to extend to the insulation layer 3, electrons or positive holes existing in the vicinity of the field shield region 53 would not be able to move freely, because of presence of the gettering sites. As shown in FIG. 13, desirably the gettering sites are formed from a plurality of holes.

A method of forming the semiconductor device as shown in FIGS. 13 and 14 will now be described.

FIGS. 15A to 15D show processes for manufacturing the semiconductor device shown in FIGS. 13 and 14.

As in the case of the embodiment 1, there is prepared an SOI wafer, and impurities are implanted into predetermined regions within the element fabrication region, thereby forming the active regions 51 which is to act as the source/drain region of a MOS transistor. As a result, the SOI wafer assumes a cross section such as that shown in FIG. 15A. The active regions 51 are spaced a predetermined distance apart from each other so as to prevent contact between adjacent semiconductor elements (MOS transistors).

Figure 15A:
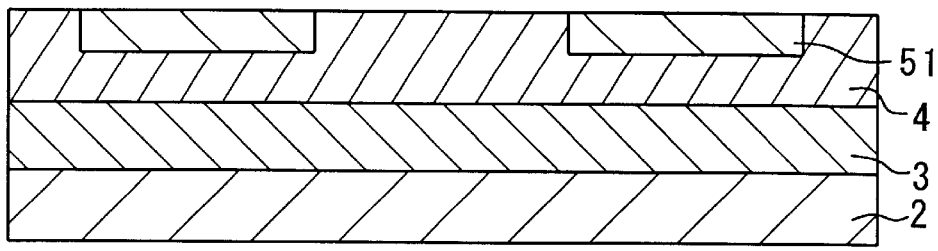
FIGS. 15A to 15D show processes for manufacturing the semiconductor device shown in FIGS. 13 and 14.
Figure 15B:
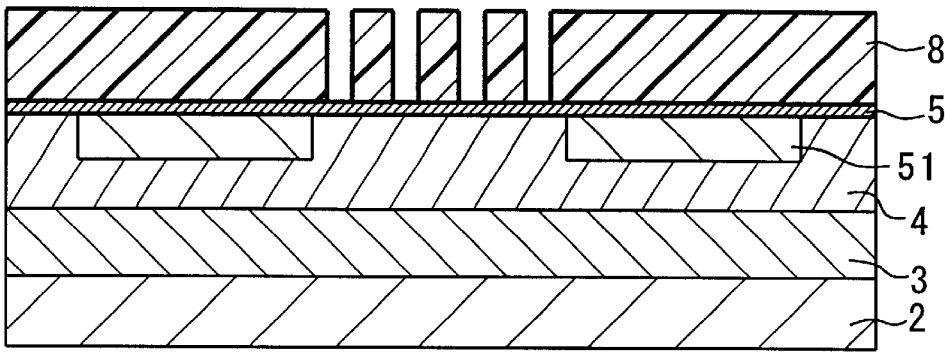

After formation of the active regions 51, the protective film 5 is formed on the SOI substrate. As shown in FIG. 15B, the photoresist film 8 is applied over the protective film 5 and is formed so as to have openings in a predetermined pattern, through a transfer process. The pattern of the openings is defined such that openings are formed in predetermined regions within the field shield isolation region 53; specifically, such that a plurality of holes are formed within the field shield isolation region 53.

Figure 15C:
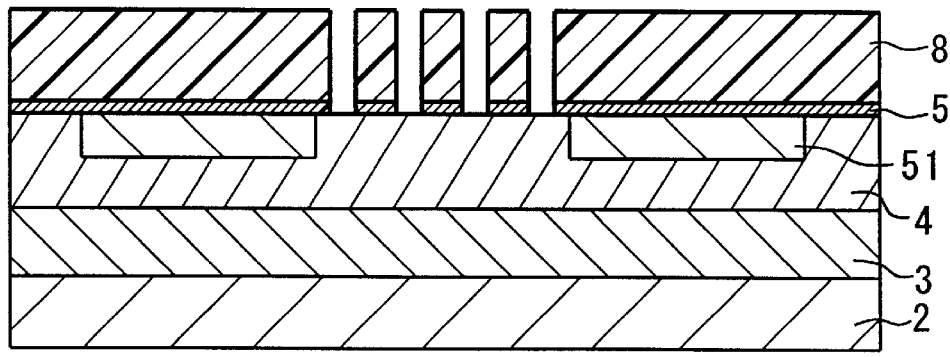

As shown in FIG. 15C, the opening pattern is transferred to the protective film 5 through plasma etching or etching with chemicals. At this time, even if a portion of the protective film 5 is not completely eliminated and remains intact, such a remaining protective film 5 does not cause any problem. Even if the protective film 5 is eliminated accurately, the plurality of holes to be formed have small diameters, and the holes 54 cannot be correctly formed later. Even if slight errors arise in formation of the holes, no problems arise. In this way, since there is no necessity for correct elimination of the protective film 5, correct etching is not required, and the holes can be formed readily. Needless to say, the protective film 5 may be eliminated correctly.

Figure 15D:
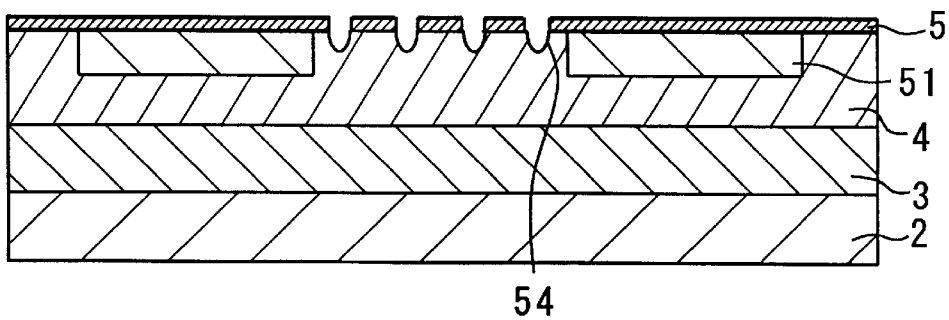

The SOI wafer assumes a cross-section such as that shown in FIG. 15D, by penetrating an alkaline solution, such as potassium hydroxide, into the SOI wafer; etching the surface of the silicon layer 4; forming the holes 54 in the silicon layer 4; and eliminating the photoresist film 8. The holes 54 are formed so as to assume a diameter of about 0.1 to 1.0 µm and such that the bottoms of the holes 54 extend to the inside of the silicon layer 4.

After formation of the holes 54, a polycrystalline silicon film is deposited in the holes 54 by CVD, and the polycrystalline silicon film deposited on the silicon layer 4 is eliminated by plasma etching or by CMP, thus constituting gettering sites.

After formation of the gettering sites, a gate oxide film 56 is formed on the active regions 51 by the known method, and the gate electrodes 52 are formed on the gate oxide film 56, thus fabricating a MOS transistor. The silicon oxide film 57 is formed on the silicon layer 4 within the field shield isolation region 53 which is outside the active regions 51, and the electrodes 58 are formed on the silicon oxide films 57.

In the semiconductor device according to the embodiment 5, gettering sites are formed within the field shield isolation region in the vicinity of the active regions, and hence the gettering sites are formed in the vicinity of semiconductor elements. There is yielded a great effect of preventing diffusion of contaminants to channels along which electrons are input or output to memory cells, such as channels between the memory cells, channels between memory cells and wiring patterns (contact holes), and channels between the sources and drains of transistors, thereby preventing deterioration in performance of semiconductor elements.

The silicon layer remains below the gettering sites, so that the field shield isolation characteristics of the semiconductor device are not impaired. More specifically, gettering sites can be formed without a necessity for taking into consideration design of a device.

In the embodiments 2 through 5, the grooves and holes are not limited to specific profiles. Desirably, the bottom surfaces of the grooves and holes assume downwardly-protruding conical shapes. By forming the grooves and holes into such a conical profile, the same advantageous result as that described in connection with the embodiment 1 can be yielded.

A semiconductor device according to the present invention including a semiconductor wafer of SOI structure which has a insulation layer and a silicon layer provided thereon; wherein the semiconductor wafer has a plurality of element fabrication regions where semiconductor elements are fabricated and a cutting region provided between the element fabrication regions, the semiconductor device being characterized in that gettering sites are formed in the cutting region by means of embedding a gettering member in grooves of a predetermined dept. A large gettering capacity can be ensured for the gettering sites, and sufficient gettering performance can be ensured. Further, since the gettering sites are formed within the silicon layer, the gettering sites can be formed at a position close to an active layer, thereby greatly improving gettering performance.

A semiconductor device according to the present invention including a semiconductor substrate of SOI structure which has a insulation layer and a silicon layer provided thereon; and memory cells provided on the semiconductor substrate, the semiconductor device being characterized in that gettering sites are formed around the memory cells by means of embedding a gettering member in grooves of predetermined depth. A large gettering capacity can be ensured for the gettering sites, and sufficient gettering performance can be ensured. Further, the gettering sites are formed over the entire SOI substrate so as to surround the memory cells, thereby protecting the memory cells from contaminants, such as metal impurities. Alternatively, in a case where peripheral circuits are spaced a predetermined distance apart from the memory cells, semiconductor elements such as the peripheral circuits can be protected without fail. Moreover, since the gettering sites are formed within the silicon layer, the gettering sites are formed at a position close to an active layer, thus improving gettering performance.

A semiconductor device according to the present invention including a semiconductor substrate of SOI structure which has a insulation layer and a silicon layer provided thereon; a MOS transistor which is provided on the silicon layer and is fabricated by way of a source/drain region and a gate oxide film; an interlayer insulation film which is provided on the MOS transistor and at an elevated position with respect to the vicinity of the MOS transistor; a conductor provided in the interlayer insulation film; and contact holes which are provided in the interlayer insulation film so as to electrically connect the conductor to the source or drain region and are filled with a conductor, the semiconductor device being characterized in that holes are formed in the vicinity of the MOS transistor so as to extend from a position above the interlayer insulation film to the inside of a silicon layer provided below the interlayer insulation film, and gettering sites are formed by means of embedding a gettering member in the holes. As a result, the area of a region of the gettering sites can be reduced. Further, gettering sites can be formed in the vicinity of the MOS transistor. In the event of damage to the SOI substrate (i.e., occurrence of crystal defects) and introduction of contaminants, which would be caused by etching a contact hole, the contaminants can be captured immediately, thus enabling highly-efficient gettering performance.

A semiconductor device according to the present invention including a semiconductor substrate of SOI structure which has a insulation layer and a silicon layer provided thereon, wherein the semiconductor substrate comprises an active region where a MOS transistor is fabricated, and a field shield isolation region provided in the vicinity of the active region, the semiconductor device being characterized in that an electrode is formed on the silicon layer within the field shield isolation region by way of an oxide film; and gettering sites are formed in the silicon layer within the field shield isolation region by means of embedding a gettering member in holes of predetermined depth. As a result, the gettering sites are formed in the vicinity of the semiconductor element, and there is yielded a great effect of preventing diffusion of contaminants to channels along which electrons are input or output to memory cells, such as channels between the memory cells, channels between memory cells and wiring patterns (contact holes), and channels between the sources and drains of transistors, thereby preventing deterioration in performance of semiconductor elements.

In the semiconductor device, the grooves may have a linear shape or a ring-shaped profile.

In the semiconductor device, the grooves may have a hole shape.

In the semiconductor device, the bottoms of the grooves may be set so as to extend to the inside of the silicon layer.

In the semiconductor device, the bottoms of the grooves may be set so as to extend to the inside of the insulation layer.

In the semiconductor device, the gettering member may be polycrystalline silicon or silicon oxide.

In the semiconductor device, the gettering sites may include: first gettering sites in which the bottoms of the grooves being set so as to extend to the inside of the silicon layer as well as embedding gettering member is silicon oxide; and second gettering sites in which the bottoms of the grooves being set so as to extend to the inside of the insulation layer as well as embedding gettering member is polycrystalline silicon.

In the semiconductor device, a thermal oxide film may be formed on the side walls of the grooves, and polycrystalline silicon is embedded in the grooves.

Here, the semiconductor device, may further comprise peripheral circuits providing on the semiconductor substrate so as to be spaced a predetermined distance apart from the memory cells and are involved in the operation of the memory cells; wherein the gettering sites are provided between the memory cells and the peripheral circuits.

In the semiconductor device, the peripheral circuits may be sense amplifiers circuits or decoder circuits.

In the semiconductor device, the grooves may have a linear shape or a ring-shaped profile surrounding the memory cells.

In the semiconductor device, the grooves may have a hole shape.

In the semiconductor device, the bottom surface of each of the grooves may be a downwardly-projecting cone shape.

In the semiconductor device, the gettering member may be polycrystalline silicon or silicon oxide.

In the semiconductor device, the gettering sites may include: first gettering sites in which the bottoms of the grooves being set so as to extend to the inside of the silicon layer as well as embedding gettering member is silicon oxide; and second gettering sites in which the bottoms of the grooves being set so as to extend to the inside of the insulation layer as well as embedding gettering member is polycrystalline silicon.

In the semiconductor device, a thermal oxide film may be formed on the side walls of the grooves, and polycrystalline silicon is embedded in the grooves.

Here, the semiconductor device may further comprise: a conductor being mutually opposed to the conductor; and a DRAM being constituted by a capacitor which has the mutually opposing conductors and by the MOS transistor.

Here, the semiconductor device may have a plurality of the MOS transistors, and further comprises a SRAM in which one end of one of the conductors is electrically connected to the source region or the drain region of one of the MOS transistors as well as the other end of one of the conductors is electrically connected to the gate electrode of another one of the MOS transistors.

There is provided a semiconductor device comprising a semiconductor substrate of SOI structure which has a insulation layer and a silicon layer provided thereon, wherein the semiconductor substrate has an active region where a MOS transistor is fabricated, and a field shield isolation region provided in the vicinity of the active region, wherein the semiconductor device has an electrode being formed on the silicon layer within the field shield isolation region by way of an oxide film, and in the silicon layer within the field shield isolation region, gettering sites which have grooves of a predetermined depth and gettering member embedding in the grooves.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 11-126893 filed on May 7, 1999 including specification, claims, drawings and summary are incorporated herein by reference in its entirety.

What is claimed is:

1. A semiconductor device comprising a semiconductor wafer of SOI structure which has a insulation layer and a silicon layer provided thereon, wherein said semiconductor wafer has a plurality of element fabrication regions where semiconductor elements are fabricated and a cutting region provided between said element fabrication regions, said semiconductor device has, in said cutting region, gettering sites which have grooves of a predetermined depth and gettering member embedding in said grooves.

2. The semiconductor device according to claim 1, wherein said grooves have a linear shape or a ring-shaped profile.

3. The semiconductor device according to claim 1, wherein said grooves have a hole shape.

4. The semiconductor device according to claim 1, wherein the bottoms of said grooves are set so as to extend to the inside of said silicon layer.

5. The semiconductor device according to claim 1, wherein the bottoms of said grooves are set so as to extend to the inside of said insulation layer.

6. The semiconductor device according to claim 1, wherein said gettering member is polycrystalline silicon or silicon oxide.

7. The semiconductor device according to claim 1, wherein said gettering sites include:

first gettering sites in which the bottoms of said grooves being set so as to extend to the inside of said silicon layer as well as embedding gettering member is silicon oxide; and second gettering sites in which the bottoms of said grooves being set so as to extend to the inside of said insulation layer as well as embedding gettering member is polycrystalline silicon.

8. The semiconductor device according to claim 1, wherein a thermal oxide film is formed on the side walls of said grooves, and polycrystalline silicon is embedded in said grooves.

9. A semiconductor device comprising a semiconductor substrate of SOI structure which has a insulation layer and a silicon layer provided thereon; and memory cells provided on said semiconductor substrate, said semiconductor device has, around said memory cells, gettering sites which have grooves of a predetermined depth and gettering member embedding in said grooves.

10. The semiconductor device according to claim 9, further comprises peripheral circuits providing on said semiconductor substrate so as to be spaced a predetermined distance apart from said memory cells and are involved in the operation of said memory cells; wherein said gettering sites are provided between said memory cells and said peripheral circuits.

11. The semiconductor device according to claim 10, wherein said peripheral circuits are sense amplifiers circuits or decoder circuits.

12. The semiconductor device according to claim 9, wherein said grooves have a linear shape or a ring-shaped profile surrounding said memory cells.

13. The semiconductor device according to claim 9, wherein said grooves have a hole shape.

14. The semiconductor device according to claim 9, wherein the bottom surface of each of said grooves is a downwardly-projecting cone shape.

15. The semiconductor device according to claim 9, wherein said gettering member is polycrystalline silicon or silicon oxide.

16. The semiconductor device according to claim 9, wherein said gettering sites include:

first gettering sites in which the bottoms of said grooves being set so as to extend to the inside of said silicon layer as well as embedding gettering member is silicon oxide; and second gettering sites in which the bottoms of said grooves being set so as to extend to the inside of said insulation layer as well as embedding gettering member is polycrystalline silicon.

17. The semiconductor device according to claim 9, wherein a thermal oxide film is formed on the side walls of said grooves, and polycrystalline silicon is embedded in said grooves.

18. A semiconductor device comprising:

a semiconductor substrate of SOI structure which has a insulation layer and a silicon layer provided thereon;

a MOS transistor being provided on the silicon layer and having a gate electrode fabricated by way of a source/drain region and an gate insulation film;

an interlayer insulation film being provided on said MOS transistor and at an elevated position with respect to the vicinity of said MOS transistor;

a conductor being provided in said interlayer insulation film; and contact holes being provided in said interlayer insulation film so as to electrically connect said conductor to the source region or the drain region and being filled with a conductor, wherein said semiconductor device has, in the vicinity of said MOS transistor, gettering sites which have holes being formed so as to extend from a position above said interlayer insulation film to the inside of a silicon layer provided below said interlayer insulation film and gettering member embedding in said holes.

19. The semiconductor device according to claim 18, further comprising:

a conductor being mutually opposed to said conductor; and a DRAM being constituted by a capacitor which has said mutually opposing conductors and by said MOS transistor.

20. The semiconductor device according to claim 18, wherein said semiconductor device has a plurality of said MOS transistors, and further comprises a SRAM in which one end of one of said conductors is electrically connected to the source region or the drain region of one of said MOS transistors as well as the other end of one of said conductors is electrically connected to the gate electrode of another one of said MOS transistors.

* * * * *